United States Patent
Yu

(10) Patent No.: US 8,283,932 B2
(45) Date of Patent: Oct. 9, 2012

(54) NOISE MEASUREMENT SYSTEM IN POWER STABILIZATION NETWORK, VARIABLE FILTER APPLIED TO THE SAME, AND METHOD FOR MEASURING NOISE IN POWER STABILIZATION NETWORK

(75) Inventor: Young Gyu Yu, Seoul (KR)

(73) Assignee: LS Industrial Systems Co., Ltd., Anyang-si, Gyeonggi-do (KR)

( * ) Notice: Subject to any disclaimer, the term of this patent is extended or adjusted under 35 U.S.C. 154(b) by 386 days.

(21) Appl. No.: 12/634,618

(22) Filed: Dec. 9, 2009

(65) Prior Publication Data

US 2010/0194405 A1 Aug. 5, 2010

(30) Foreign Application Priority Data

Feb. 4, 2009 (KR) .................. 10-2009-0008811

(51) Int. Cl.
*G01R 29/26* (2006.01)

(52) U.S. Cl. ........ 324/613; 324/616; 324/614; 324/142; 324/627; 324/628; 333/174; 320/107; 361/118

(58) Field of Classification Search .................. 324/613, 324/616, 614, 142, 627, 628; 333/174; 320/107; 361/118
See application file for complete search history.

(56) References Cited

U.S. PATENT DOCUMENTS

| | | | | |
|---|---|---|---|---|
| 3,525,991 A * | 8/1970 | Kohler | ........................... | 341/169 |
| 3,591,711 A * | 7/1971 | De Groat | .................. | 379/93.37 |
| 3,922,608 A * | 11/1975 | Denny | ........................... | 324/555 |
| 4,124,895 A * | 11/1978 | Takise et al. | ..................... | 381/58 |
| 4,229,694 A * | 10/1980 | Wilson et al. | .................... | 361/20 |
| 4,475,150 A * | 10/1984 | D'Atre et al. | ................... | 363/51 |
| 4,496,899 A * | 1/1985 | Lippitt et al. | ................. | 323/207 |
| 4,683,409 A * | 7/1987 | Boillat | ........................... | 318/696 |
| 5,136,575 A * | 8/1992 | Kuroda | ....................... | 348/14.01 |
| 5,416,386 A * | 5/1995 | Nilssen | ..................... | 315/209 R |
| 5,422,546 A * | 6/1995 | Nilssen | ........................ | 315/219 |
| 5,426,349 A * | 6/1995 | Nilssen | ........................ | 315/219 |
| 5,440,209 A * | 8/1995 | Nilssen | ........................ | 315/219 |
| 5,459,375 A * | 10/1995 | Nilssen | ........................ | 315/247 |
| 5,471,118 A * | 11/1995 | Nilssen | ........................ | 315/247 |
| 5,481,160 A * | 1/1996 | Nilssen | ..................... | 315/209 R |
| 5,583,423 A * | 12/1996 | Bangerter | ...................... | 323/239 |
| 5,783,977 A * | 7/1998 | Chethik | ........................ | 333/174 |
| 6,140,822 A * | 10/2000 | Williams | ...................... | 324/620 |
| 6,426,632 B1 * | 7/2002 | Clunn | ............................ | 324/509 |
| 6,778,827 B1 * | 8/2004 | Anderson et al. | ............ | 455/434 |

(Continued)

FOREIGN PATENT DOCUMENTS

CN 1523755 8/2004

(Continued)

*Primary Examiner* — Patrick Assouad
*Assistant Examiner* — Lamarr Brown
(74) *Attorney, Agent, or Firm* — Lee, Hong, Degerman, Kang & Waimey

(57) ABSTRACT

A noise measurement system in a power stabilization network, a variable filter applied to the power stabilization network, and a method for measuring noise in the power stabilization network are provided. A power line communication signal from the power stabilization network is attenuated relative to a particular frequency using a filter in order to allow the power line communication signal to operate within an input range of an Electromagnetic Interference (EMI) measurer. A signal from a forbidden frequency band is transmitted to the EMI measurer without any attenuation or influence on a noise floor.

12 Claims, 4 Drawing Sheets

U.S. PATENT DOCUMENTS

| | | | |
|---|---|---|---|
| 6,870,733 B2 * | 3/2005 | Castell et al. | 361/679.56 |
| 7,091,849 B1 * | 8/2006 | Henry | 340/538.12 |
| 7,145,440 B2 * | 12/2006 | Gerszberg et al. | 375/258 |
| 7,453,353 B1 * | 11/2008 | Henry | 340/538.12 |
| 7,561,025 B2 * | 7/2009 | Gerszberg et al. | 340/12.32 |
| 7,626,378 B1 * | 12/2009 | Fest | 324/142 |
| 7,773,361 B2 * | 8/2010 | Davidow | 361/118 |
| 7,880,477 B2 * | 2/2011 | Forstner | 324/613 |
| 7,969,164 B2 * | 6/2011 | Tang et al. | 324/627 |
| 7,969,298 B2 * | 6/2011 | Henry | 340/538.12 |
| 2002/0196029 A1 * | 12/2002 | Schmidt | 324/500 |
| 2004/0131198 A1 * | 7/2004 | Watanabe et al. | 381/71.7 |
| 2006/0082219 A1 * | 4/2006 | Gerszberg et al. | 307/1 |
| 2006/0114925 A1 * | 6/2006 | Gerszberg et al. | 370/431 |
| 2006/0119742 A1 * | 6/2006 | Park | 348/730 |
| 2006/0164101 A1 * | 7/2006 | Fossion et al. | 324/539 |
| 2007/0030093 A1 * | 2/2007 | Gerszberg et al. | 333/109 |
| 2007/0152628 A1 * | 7/2007 | Lee | 320/107 |
| 2007/0222637 A1 * | 9/2007 | Davidow | 340/870.02 |
| 2007/0224940 A1 * | 9/2007 | Pankinaho et al. | 455/62 |
| 2008/0079419 A1 * | 4/2008 | Lyon | 324/158.1 |
| 2008/0106270 A1 * | 5/2008 | Crick | 324/613 |
| 2008/0254812 A1 * | 10/2008 | Kitazoe | 455/456.2 |
| 2008/0279268 A1 * | 11/2008 | Iwai et al. | 375/227 |
| 2009/0140849 A1 * | 6/2009 | Henry | 340/538.12 |
| 2010/0225531 A1 * | 9/2010 | Johnson | 342/25 A |

FOREIGN PATENT DOCUMENTS

| | | |
|---|---|---|
| CN | 101221422 | 7/2008 |

* cited by examiner

NOISE MEASUREMENT SYSTEM IN POWER STABILIZATION NETWORK, VARIABLE FILTER APPLIED TO THE SAME, AND METHOD FOR MEASURING NOISE IN POWER STABILIZATION NETWORK

CROSS-REFERENCE TO RELATED APPLICATION

The present application is based on, and claims priority from, Korean Application Numbers 10-2009-0008811, filed Feb. 4, 2009, the disclosure of which is incorporated by reference herein in its entirety.

BACKGROUND

The present disclosure relates to a noise measurement system in power stabilization network, a variable filter applied to the same and a method for measuring noise in power stabilization network, and more particularly to a noise measurement system in power stabilization network, a variable filter applied to the same and a method for measuring noise in power stabilization network capable of allowing a power line communication signal to operate within an EMI (Electromagnetic Interference) measurer using a filter that attenuates a particular frequency only.

The power line communication (PLC) is regarded as the most suitable medium in home network, home automation, remote meter reading, factory automation and the like due to its advantage of technology that encodes data in a signal and transmits the signal on existing electricity power lines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs.

A radio waves Act and related rules were enacted in 2005 to regulate power line communication products. As a result, all the power line communication products must acquire an electromagnetic compatibility registration before being marketed. Appended No. 5, KN22 and Appended No. 11, KN 60 prescribe an EMI (Electromagnetic Interference) standard testing method with regard to the electromagnetic compatibility registration for power line communication.

The power line communication usually contains lots of harmonic noises and experiences a wide range of variable impedances. The noises and impedances may exist in various shapes and sizes according to time and place. Therefore, it is imperative to build up an experimental environment lest a measurement sample should be influenced, by interrupting or removing the noises at a predetermined or more level and by maintaining the impedance at a constant level.

SUMMARY

Accordingly, the present disclosure is directed to a noise measurement system in power stabilization network, a variable filter applied to the same and a method for measuring noise in power stabilization network that substantially obviates one or more problems due to limitations and disadvantages of the related art. Therefore, it is an object of the present disclosure to attenuate a power line communication signal to operate within an input scope of an EMI measurer by using a filter capable of attenuating a particular frequency, and to allow a signal in frequency band that cannot be operated for weak power radio station (hereinafter referred to as "forbidden frequency band") to be transferred without any attenuation, thereby affecting no influence on a noise floor.

In one general aspect of the present disclosure, a noise measurement system in power stabilization network may comprise: a power stabilization network including a power input unit for receiving an external power, a power output unit for supplying a power to a power line communication modem and an output unit for a measurement instrument; a filter connected to the power stabilization network; and an EMI (Electromagnetic Interference) measurer.

In some exemplary embodiment of the present disclosure, the filter may be connected to the output unit for a measurement instrument, or to the power output unit.

In some exemplary embodiment of the present disclosure, the filter may be a high pass filter or a variable filter.

In some exemplary embodiment of the present disclosure, the variable filter may include a filter input unit connected to the power stabilization network, a variable filter unit connected to the filter input unit, information input unit for inputting information on a forbidden frequency band, and a controller for setting up the number of frequency of the variable filter unit in response to the information on the forbidden frequency band.

In some exemplary embodiment of the present disclosure, the variable filter may further include a display unit for displaying a state of the forbidden frequency band in response to an instruction from the controller.

In some exemplary embodiment of the present disclosure, the variable filter may further include a filter output unit connected to the EMI measurer.

In some exemplary embodiment of the present disclosure, the EMI measurer may include an attenuator.

In some exemplary embodiment of the present disclosure, the EMI measurer can correct a final value as much as a forbidden frequency band attenuation rate at below 525 kHz.

In another general aspect of the present disclosure, a method for measuring noise in power stabilization network, comprising: supplying power to the power stabilization network; selecting and attenuating a region except for a forbidden frequency band through a filter relative to a signal outputted from the power stabilization network; and measuring, by an EMI measurer, a signal removed of noise.

In some exemplary embodiment of the present disclosure, the step of selecting and attenuating a region except for a forbidden frequency band may include a step of selecting and attenuating a region except for the forbidden frequency band through a variable filter.

In some exemplary embodiment of the present disclosure, the step of selecting and attenuating a region except for the forbidden frequency band through a variable filter may include a step of setting up the forbidden frequency band using a user input unit.

In some exemplary embodiment of the present disclosure, the step of measuring, by an EMI measurer may include a step of correcting, by the EMI measurer, a final value as much as a forbidden frequency band attenuation rate at below 525 kHz.

DETAILED DESCRIPTION

Exemplary embodiments of the present disclosure will be described in detail with reference to the accompanying drawings.

Figure 1:
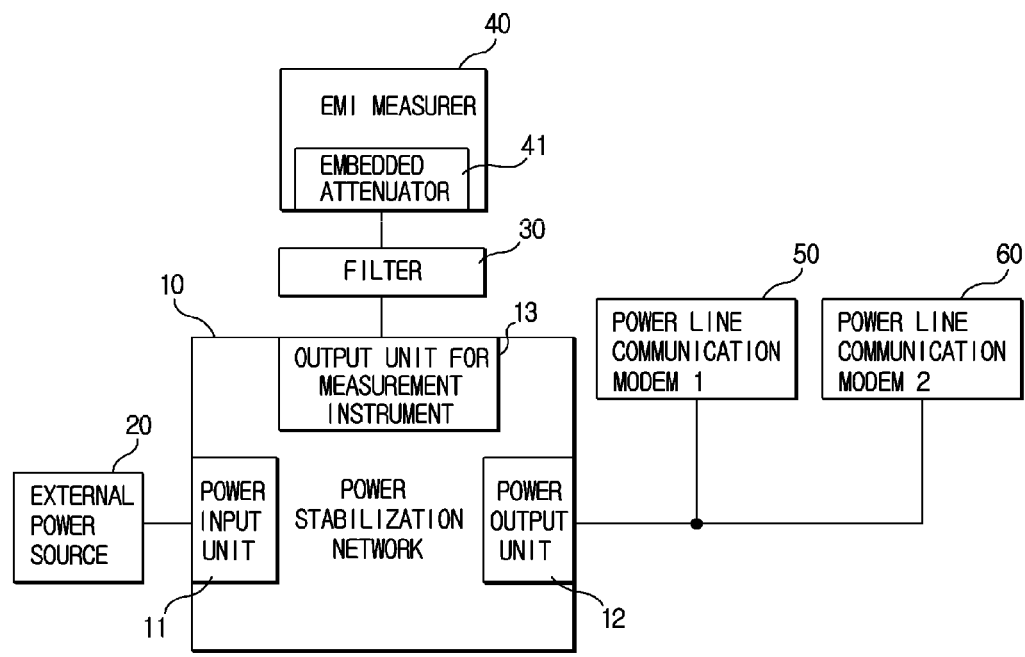
FIG. 1 is a schematic diagram illustrating a noise measurement system in power stabilization network according to an exemplary embodiment of the present disclosure.

FIG. 1 is a schematic diagram illustrating a noise measurement system in power stabilization network according to an exemplary embodiment of the present disclosure.

Referring to FIG. 1, a noise measurement system in a power stabilization network according to the present disclosure may include a power stabilization network 10, a power source 20, a filter 30 and an EMI measurer 40.

The power stabilization network 10 may include a power input unit 11 for receiving power from an external power, a power output unit 12 for supplying power to power line communication modems 50, 60 and an output unit for measurement instrument 13. The EMI measurer 40 may include an embedded attenuator 41.

The external power 20 includes lot of harmonic noises and impedance changes in the external power 20 are great. These noises and impedances exist in various shapes according to time and place. Therefore, it is important to build up a testing environment in which the noises are blocked or removed to a certain level and the impedances are maintained at a constant level.

The EMI measurer 40 serves to measure a conducted noise existing in a power line at a power output side of power stabilization network. The EMI measurer 40 has a maximum input value, and if a value exceeding the maximum input value is received, damage may occur to the equipment and distortion may also occur in the measurement result. In order to solve the problems, the filter 30 interposed between the output unit for measurement instrument 13 and the EMI measurer 40 is utilized to adjust the input value.

The power line communication modems 50, 60 are connected to the power output unit 12, and while the two modems communicate in maximum output, the EMI measurer 40 measures noise in the forbidden frequency band. At this time, the filter 30 is preferably a high pass filter.

Figure 2:
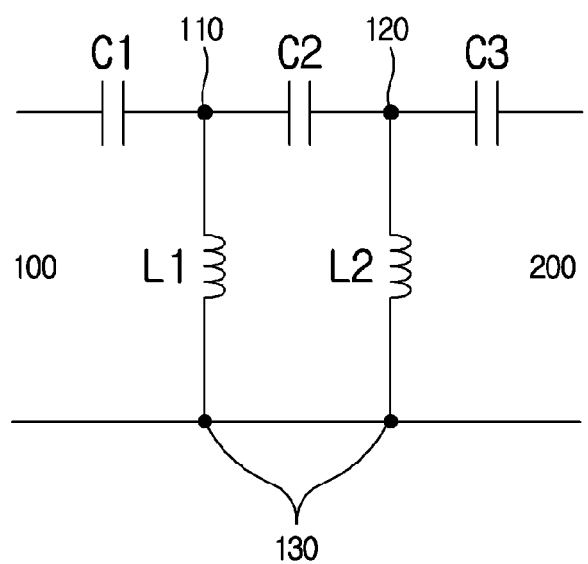
FIG. 2 is a schematic view illustrating an exemplary high pass filter applied to a noise measurement system in power stabilization network according to an exemplary embodiment of the present disclosure.

FIG. 2 is a schematic view illustrating an exemplary high pass filter applied to a noise measurement system in power stabilization network according to an exemplary embodiment of the present disclosure.

Referring to FIG. 2, the high pass filter may include a first capacitor interposed between an input terminal 100 and a first node 110, a second capacitor interposed between the first node 110 and a second node 120, a third capacitor interposed between the second node120 and a third node 130, and a first coil and a second coil each arranged in the first node 110, the second node 120 and the third node 130.

Although a fifth order high pass filter is used in the present disclosure, it should be noted that the high pass filter is not limited to the fifth order high pass filter but may include any high order high pass filter.

Figure 3:
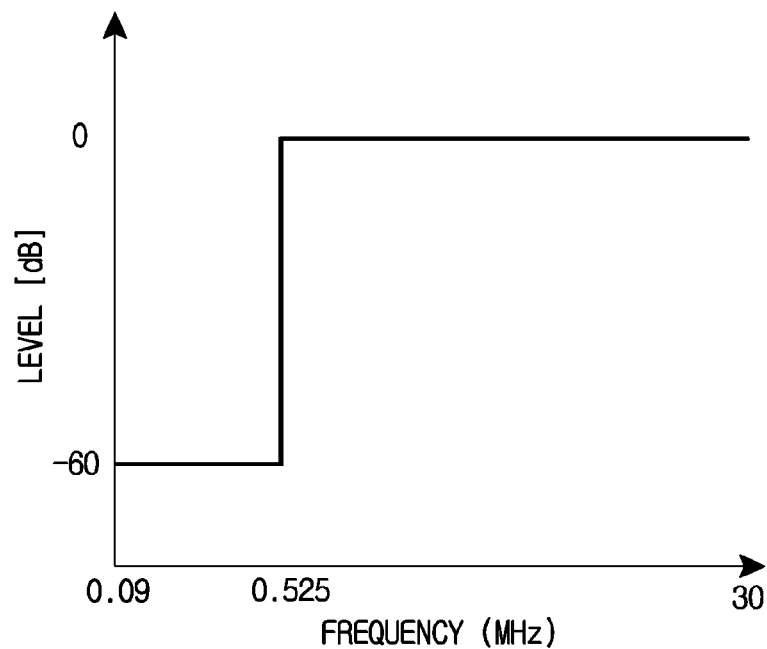
FIG. 3 is a graph illustrating a characteristic of a high pass filter applied to a noise measurement system in a power stabilization system according to an exemplary embodiment of the present disclosure.

FIG. 3 is a graph illustrating a characteristic of a high pass filter applied to a noise measurement system in a power stabilization system according to an exemplary embodiment of the present disclosure.

Referring to FIG. 3, the high pass filter applied to the noise measurement system in a power stabilization network attenuates frequencies less than 525 KHz but pass frequencies high than 525 KHz. The high pass filter is suitable for a low speed power line communication method.

Figure 4:
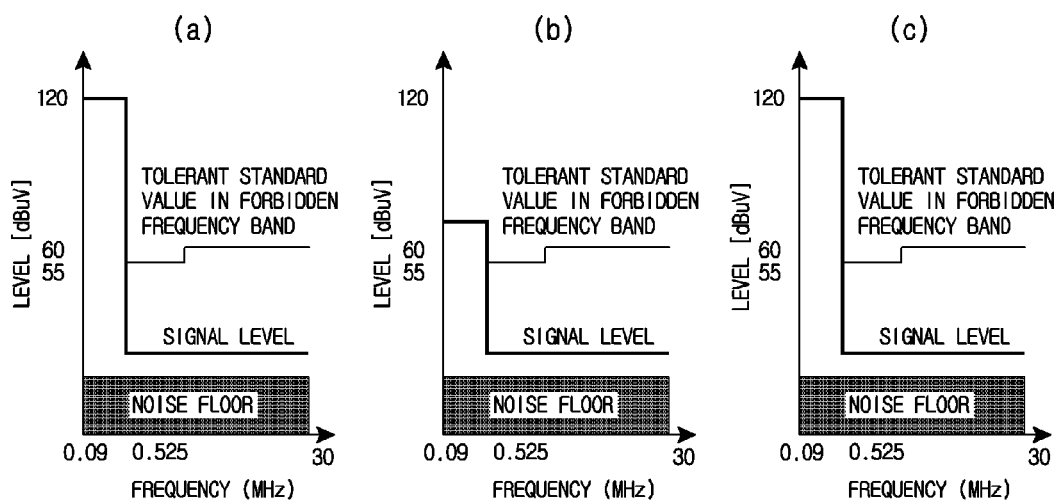
FIG. 4 is a graph illustrating a characteristic of a noise measurement system in power stabilization network using a high pass filter according to an exemplary embodiment of the present disclosure.

FIG. 4 is a graph illustrating a characteristic of a noise measurement system in power stabilization network using a high pass filter according to an exemplary embodiment of the present disclosure, where (a) refers to a graph illustrating a characteristic at an input terminal of the filter 30, (b) defines a graph illustrating a characteristic at an output terminal of the filter 30 and (c) is a graph illustrating a final value at the EMI measurer.

As shown in the drawings, a signal level at a filter input is below an allowable standard value in the forbidden frequency band. Use of the high pass filter of FIG. 3 makes it possible to attenuate signals less than 525 KHz and yet pass signals in the forbidden frequency band without attenuation. Therefore, signals less than 525 KHz are attenuated in filter output whereas signals in the forbidden frequency band remain unaffected. As a result, the final value of the EMI measurer is corrected as much as filter forbidden frequency attenuation rate at less than 525 KHz.

The present disclosure uses a filter to attenuate a power line communication signal only and yet transmits signals in the forbidden frequency band without any attenuation. This method attenuates the power line communication signals only such that a noise floor in the forbidden frequency band is not increased.

Figure 5:
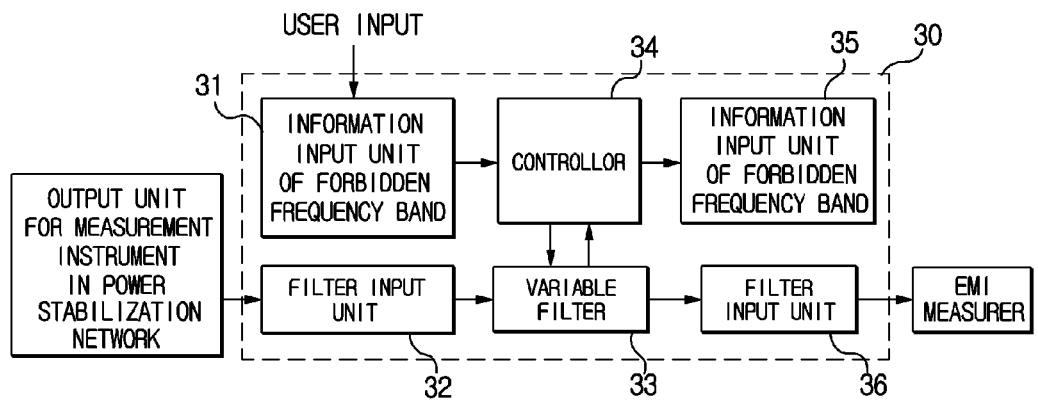
FIG. 5 is a schematic diagram illustrating a variable filter applied to a noise measurement system in power stabilization network according to an exemplary embodiment of the present disclosure.

FIG. 5 is a schematic diagram illustrating a variable filter applied to a noise measurement system in power stabilization network according to an exemplary embodiment of the present disclosure.

It should be apparent that the forbidden frequency band is variably applied according to country and region to make a filter characteristic variable.

A filter passing through multiple forbidden frequency band cannot be configured by a common passive filter of FIG. 2. Therefore, it should be natural that a variable forbidden frequency band needs a variable filter.

The variable filter of FIG. 5 may include a forbidden frequency band information input unit 31, a filter input unit 32, a variable filter unit 33, a controller 34, a forbidden frequency band display unit 35 and a filter output unit 36. The forbidden frequency band information input unit 31 is embedded in a variable filter in order to input the forbidden frequency band that is differently applied according to region and country.

The forbidden frequency band is inputtable by a user, and a frequently used forbidden frequency band may be stored and reused later. The filter input unit 32 is a constituent element for receiving a signal from the output unit for measurement instrument 13 of the power stabilization network. A signal supplied from the filter input unit 32 is provided to the variable filter unit 33. The controller 34 receives information from the forbidden frequency band information input unit 31 to set up a frequency of the variable filter unit 33. The set-up frequency of the variable filter unit 33 is measured again where the re-measured frequency is compared with information inputted from the information input unit, and if these are identical, a result thereof is displayed on the forbidden frequency band display unit 35.

The variable filter unit 33 receives a forbidden frequency band from the controller 34 to set a gain of the forbidden frequency band at 0 dB, thereby allowing a sufficient attenuation except for the forbidden frequency band. The filter input unit is connected to from the output unit for measurement instrument 13 of the power stabilization network to transfer a signal to the variable filter unit 33. The filter output unit 36 is connected to an input unit of the EMI measurer 40 to transfer a signal of the variable filter to the EMI measurer 40.

Figure 6:
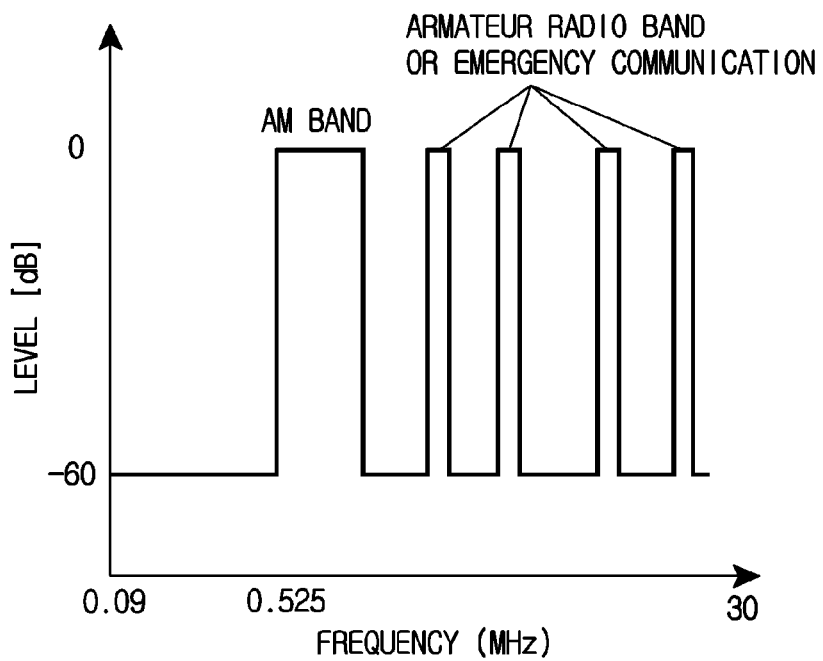
FIG. 6 is a graph illustrating a characteristic of a variable filter applied to a noise measurement system in a power stabilization system according to an exemplary embodiment of the present disclosure.

FIG. 6 is a graph illustrating a characteristic of a variable filter applied to a noise measurement system in a power stabilization system according to an exemplary embodiment of the present disclosure.

Referring to FIG. 6, the variable filter may provide a selective filtering to an Amplitude Modulation (AM) band, an amateur radio band or an emergency communication band according to a user set-up.

Figure 7:
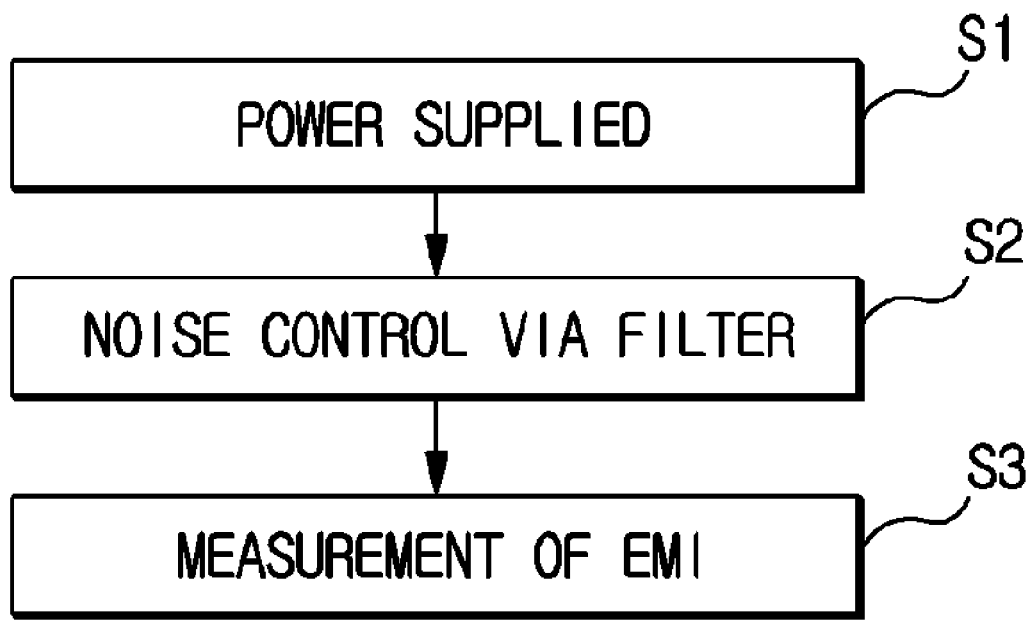
FIG. 7 is a flowchart illustrating a method for measuring noise in power stabilization network according to an exemplary embodiment of the present disclosure.

FIG. 7 is a flowchart illustrating a method for measuring noise in power stabilization network according to an exemplary embodiment of the present disclosure.

Referring to FIG. 7, a method for measuring the forbidden frequency band in the power stabilization network applied to power line communication devices may include the following steps. First, a power is supplied to the power stabilization network from an external power source (S1). A region except for the forbidden frequency band is attenuated by a filter relative to a signal generated from the power stabilization network (S2). The attenuated signal is measured by the EMI measurer (S3). To be more specific, the step of attenuating a region except for the forbidden frequency band may include a step of attenuating a region except for the forbidden frequency band through the variable filter. At this time, the step of attenuating the region except for the forbidden frequency band may include a step of setting up the forbidden frequency band using a user input unit.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

For example, the measuring method for the forbidden frequency band using the power stabilization network in a fault prevention testing in the power line communication devices may be positioned at a medium place between a power output terminal of the power stabilization network and a power line modem. The measuring method for the forbidden frequency band using the power stabilization network in a fault prevention testing in the power line communication devices may concurrently use a filter, an external attenuator or an embedded attenuator.

What is claimed is:

1. A noise measurement system comprising:
    a power stabilization network including a power input unit configured for receiving external power, a power output unit configured for supplying power to a power line communication modem and an output unit for use of a measurement instrument;
    a filter connected to the output unit and configured for selecting and attenuating a signal inputted from the output unit in response to information on a forbidden frequency band; and
    an Electromagnetic Interference (EMI) measurer connected to the filter.

2. The system of claim 1, wherein the filter is a high pass filter.

3. The system of claim 1, wherein the filter is a variable filter.

4. The system of claim 3, wherein the variable filter comprises:
    a filter input unit connected to the power stabilization network;
    a variable filter unit connected to the filter input unit;
    an information input unit configured for inputting the information on the forbidden frequency band; and
    a controller configured for setting up a number of frequencies of the variable filter unit in response to the information on the forbidden frequency band.

5. The system of claim 4, wherein the variable filter further comprises a display unit configured for displaying a state of the forbidden frequency band in response to an instruction from the controller.

6. The system of claim 4, wherein the variable filter further comprises a filter output unit connected to the EMI measurer.

7. The system of claim 1, wherein the EMI measurer includes an attenuator.

8. The system of claim 1, wherein the EMI measurer is configured for correcting a final measured value from the EMI measurer according to a forbidden frequency band attenuation rate when the forbidden frequency is below 525 kHz.

9. A method for measuring noise in a power stabilization network, the method comprising:
    supplying power to the power stabilization network;
    selecting and attenuating, using a filter, a region other than a forbidden frequency band relative to a signal output from an output unit for use of a measurement unit; and
    measuring, by an EMI measurer, signal with noise removed from the signal.

10. The method of claim 9, wherein the selecting and attenuating the region other than the forbidden frequency band is performed via a variable filter.

11. The method of claim 10, wherein selecting and attenuating the region other than the forbidden frequency band further comprises:
    setting up the forbidden frequency band using a user input unit.

12. The method of claim 9, wherein measuring the signal comprises:
    correcting, by the EMI measurer, a final measured value from EMI measurer according to a forbidden frequency band attenuation rate when a frequency is below 525 kHz.

* * * * *